(12) United States Patent
Matsumura et al.

(10) Patent No.: US 6,647,616 B1
(45) Date of Patent: Nov. 18, 2003

(54) BUMP BONDING UNIT WITH TRAY STORAGE AND TRANSPORT APPARATUSES

(75) Inventors: Nobuya Matsumura, Kyoto (JP); Hiroyuki Kiyomura, Takatsuki (JP); Kenichi Nishino, Osaka (JP); Kenji Takahashi, Suita (JP); Shinji Kanayama, Kashihara (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/446,031

(22) PCT Filed: Nov. 15, 1998

(86) PCT No.: PCT/JP98/02654
§ 371 (c)(1),
(2), (4) Date: Dec. 15, 1999

(87) PCT Pub. No.: WO98/58401
PCT Pub. Date: Dec. 23, 1998

(30) Foreign Application Priority Data

Jun. 16, 1997 (JP) .............................. 9-158933

(51) Int. Cl.[7] .............................................. B23P 21/00
(52) U.S. Cl. .............................. 29/771; 29/772; 29/739; 414/788.8; 414/794.2
(58) Field of Search ......................... 29/771, 739, 740, 29/741, 742, 832, 772; 414/788.7, 788.8, 794.2

(56) References Cited

U.S. PATENT DOCUMENTS 3,308,977 A * 3/1967 Cochran et al. .......... 198/339.1
5,822,847 A * 10/1998 Arakawa et al. .............. 29/740

FOREIGN PATENT DOCUMENTS

| JP | 8243854 | 9/1996 |
| JP | 986666 | 3/1997 |
| JP | 9110170 | 4/1997 |
| WO | 9302952 | 2/1993 |

* cited by examiner

Primary Examiner—Richard Chang

(57) ABSTRACT

A bump bonding unit is disclosed including a novel storage, transport, and feed system for allocating trays that hold IC chips to various operations of the bump bonding unit. The bump bonding unit includes fist and second tray storage and feed apparatuses that transport trays from empty stacks to full stacks and vice versa, and a transfer head for picking up an IC chip without a bump formed thereon and moving the IC chip to a bump formation location, and for picking up the IC chip with the bump formed thereon and moving the IC chip to a storage location. The bump bonding unit also includes a bump forming unit for forming the bump on the IC chip. Each tray storage apparatus includes a carrier that moves vertically to position a stack of trays, a tray receiver that cooperates with the carrier to support a lowermost tray in the respective stack of trays, and tray holder to support and release a tray supported by the tray receiver.

3 Claims, 9 Drawing Sheets

BUMP BONDING UNIT WITH TRAY STORAGE AND TRANSPORT APPARATUSES

TECHNICAL FIELD

The present invention relates to a tray storing and feeding apparatus which is used, for example, for handling a tray on which various components such as electronic components are aligned and stored in rows, and for feeding these stored components for the purpose of manufacturing an electronic circuit substrate.

BACKGROUND ART

Figure 5:
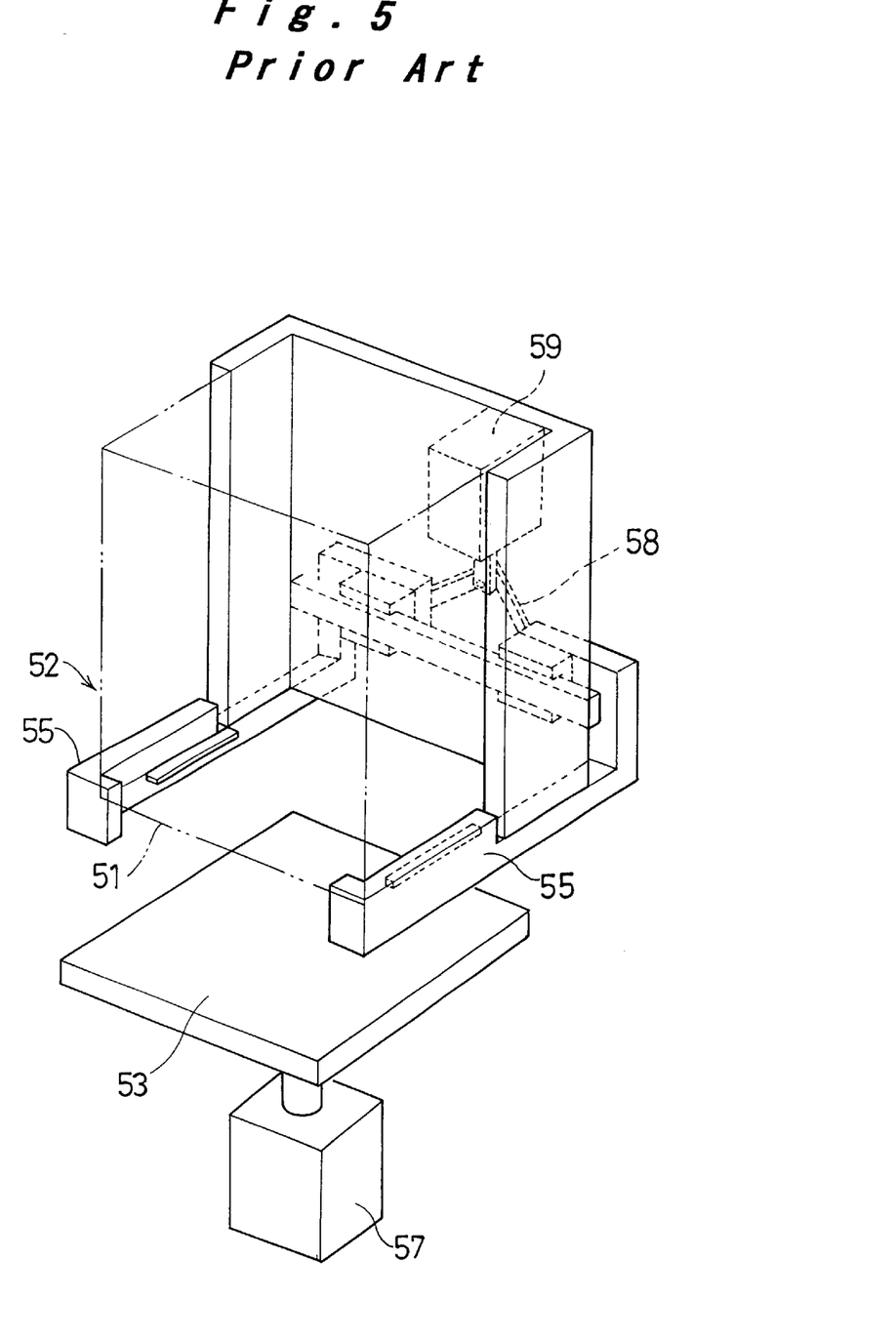
FIG. 5 is a perspective view showing primary parts of a conventional tray storing and feeding apparatus.
Figure 6A:
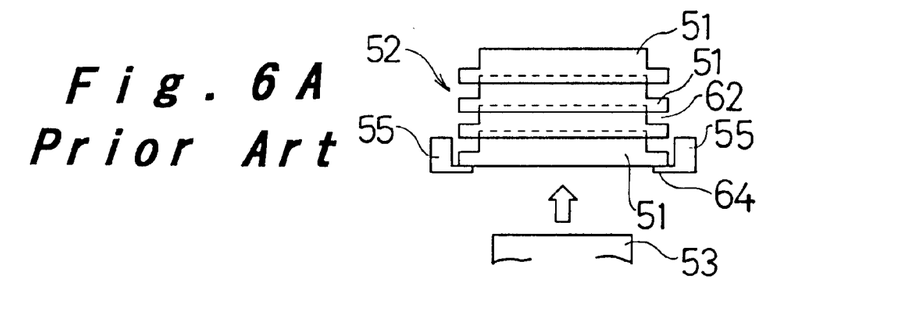
FIG. 6 is an explanatory view showing the apparatus of FIG. 5 in action for feeding trays.

A conventional apparatus of such type usually includes a tray carrier 53 which is driven vertically by a cylinder 59 for transferring a tray 51 in a tray storage section 52 as shown in FIGS. 5 and 6A–6D. The tray carrier 53 is also driven, at its lowered position, to transfer the tray 51 between a point just under the tray storage section and a position (not shown) where it receives a tray or a position (not shown) where it supplies the components accommodated on the tray 51. Provided at the tray storage section 52 is a pair of clamp members 55 which are opened and closed via a toggle 58 by a cylinder 59 shown in FIG. 5. This pair of clamp members 55 have on their opposing surfaces respective projections 64 which enter into a gap 62 between the trays 51 piled upon each other in the tray storage section 52 as shown in FIG. 6C and engage with the lower face of a tray immediately thereabove from both sides as shown in FIGS. 6A, 6C, and 6D. The projections 64 come to engagement with the tray 51 in such a way as shown in the order of FIGS. 6B and 6C, so that the tray under which the projections 64 are inserted is supported together with other trays piled thereabove in the tray storage section 52. Trays 51 under the projections 64 are received on the tray carrier 53 and descended as shown in FIG. 6D, thus being separated from the other trays 51 supported in the tray storage section 52. The separated tray 51 may be further moved to a position where the components are fed for use. Conversely, a tray 51 may be brought upward by the tray carrier 53 and be received in the tray storage section 52, after which the projections 64 are inserted under the lowermost tray for supporting the same in the order of actions respectively shown in FIGS. 6D, 6C, 6B, and 6A.

The tray 51 can be thereby automatically piled upon one another and stored in the tray storage section 52, or can be separated one by one from the stack of trays and fed to a prescribed position for supplying the components for use.

However, trays 51 which are available on the market are generally such that the space between the two trays piled upon one another is varied. Trays of some types do not allow the projections 64 of the clamp member 55 to enter into a space between two trays one upon another, in which case the trays 51 cannot be separated from each other. In particular, trays of small type form a very small or almost no space between them when piled upon one another, and in such a case it is impossible to separate the trays from each other.

The tray 51 may be held only by means of a frictional force from both sides without such projections as described above. In that case, a clamping force of the clamp member 55 must be strong enough to bear the weight of the tray 51, otherwise the tray 51 may fall, which would cause a serious problem in practice.

DISCLOSURE OF INVENTION

An object of the present invention is to provide a tray storing and feeding apparatus which is capable of certainly separating and feeding trays irrespective of spacing conditions between two trays piled upon one another while being safely constructed such as to prevent the tray from falling off.

Another object of the present invention is to provide an apparatus for handling an electronic component such as a bump bonder or electronic component mounting device in which such tray storing and feeding apparatus as mentioned above is incorporated.

To accomplish the above object, an improved tray storing and feeding apparatus of the present invention comprises a tray carrier which is movable vertically in a tray storage section for transferring a tray, a tray receiver provided in the tray storage section which is capable of opening and closing for engaging with and retracting from the tray being transferred by the tray carrier, a tray holder which opens and closes for holding the tray from both sides, and an open/close mechanism which causes the tray receiver and the tray holder to open and close timely.

With such a structure, the tray receiver and the tray holder are opened and closed timely by the open/close mechanisms such that when one tray is lifted up to the tray storage section by the tray carrier, the tray receiver is opened prior to the opening action of the tray holder. Thus, even when the space between the two trays is small or even if there is no space therebetween, the tray being lifted up can reach the tray storage section where the other trays are held by the tray holder. After that, the tray holder is opened so as to allow the tray which has been lifted up to be received at the tray storage section. When there is no other trays, the tray which has been lifted up is stored solely, and when there are other trays that are previously stored, the trays are all lifted up together so as to store the trays in a stack. Each time one tray is stored, the tray receiver and the tray holder are closed, so that the tray receiver can engage with the lower face of the newly stored tray from both sides, thereby supporting the tray. As the tray holder holds the newly stored tray from both sides at the same time, the tray can be stored safely without possibility of falling off by its own weight. Since the moment when the tray is held only with the tray holder during the tray needs to be supported is only an instance when the tray carrier is slightly lowered after the tray has been lifted up to the tray storage section, the tray will thus hardly drop, and the above-said safety is ensured.

When separating the trays one by one from the tray stack and transferring the tray to a prescribed position for feeding the components, after the tray receiver and the tray holder are opened and the tray is placed on the tray carrier which has been moved upward, the tray holder is closed prior to the closing action of the tray receiver only when the tray carrier has been descended by an amount which is equivalent to a height of one tray in the tray stack. The lowermost tray is thus separated from the other trays by further lowering the tray carrier 3, and the tray receiver is closed at the point when the lowermost tray is lifted down to a certain height, where the tray receiver can return to the state in engagement with the lower face of the tray from both sides without any interference between itself and the lowermost tray which has just been separated. Accordingly, even when the space between the trays piled upon one another is small or even if there is no such space, the trays stored in a stack can be reliably separated one by one from each other. Since the moment when the tray is held only with the tray holder while the tray needs to be supported is only for an instance when the lowermost tray is being lowered to the outside of the tray storage section so that it does not obstruct the closing action of the tray receiver during the time when one tray is separated from the others, the tray will hardly fall and the above said safety is ensured.

In addition, the present invention is characterized in that the tray receiver is urged to remain in engagement with the tray, and that the open/close mechanism for the tray receiver is constructed such that a cam provided to the tray carrier causes the tray receiver to retract sidewards via a cam follower provided to the tray receiver in synchronism with the upward movement of the tray carrier, and with the downward movement of the tray carrier, the cam causes the tray receiver via the cam follower to return to the position in engagement with the tray.

With such a structure, the tray receiving member is always urged to be engaged with the lower face of the tray, and opening and closing actions of the tray receiving member are precisely repeated with mechanical timing, which can be preliminarily determined, by means of the cam and the cam follower. The tray receiver can be thus timely opened and closed without failure with simple and inexpensive structure.

Further, in order to accomplish the above said objects, a bump bonder according to the present invention comprises a first tray storing and feeding apparatus including a first tray storing unit where trays accommodating IC chips before formation of a bump are stored in an accumulated state, a second tray storing unit for storing empty trays in a stack, and a first tray carrier for taking out a lowermost tray in the first tray storing unit and transferring the same to a chip loading position, and for transferring a tray which has been emptied at the chip loading position to the second tray storing unit and storing the same from below in the second tray storing unit; a second tray storing and feeding apparatus including a third tray storing unit where trays accommodating IC chips on which a bump has been formed are stored, a fourth tray storing unit for storing empty trays in a stack, and a second tray carrier for taking out a lowermost tray in the fourth tray storing unit and transferring the same to a chip unloading position, and for transferring a tray at the chip unloading position which has been filled with IC chips with a bump formed thereon to the third tray storing unit and storing the same from below in the third tray storing unit; a transfer head which picks up an IC chip before formation of bumps from the tray located at the chip loading position, transfers the same onto a bonding stage, picks up an IC chip on which a bump has been formed on the bonding stage, and transfers the same onto a tray located at the chip unloading position; and a bump forming unit for forming a bump on an IC chip positioned on the bonding stage, the first and second tray storing and feeding apparatuses being the tray storing and feeding apparatus as described above.

By adopting the tray storing and feeding apparatus of the present invention to the bump bonder as set forth above, tray exchange can be accomplished without stopping operation of the bump bonder. Moreover, trays can be readily loaded to and unloaded from each of the tray storing units.

Tray storing and feeding apparatus of the present invention may also be incorporated in any other apparatuses which handle electronic components such as an electronic component mounting device, which will be similarly advantageous as in the case of bump bonder described above.

BEST MODES FOR CARRYING OUT THE INVENTION

Preferred embodiments of the present invention will be hereinafter described referring to FIG. 1 to FIG. 3.

The present invention shown in the figures are embodied as a tray storing and feeding apparatus which accommodates trays accumulated one upon another on which electronic components are loaded, and is used for feeding these stored trays to a position where the components are supplied for use. The present invention is, however, not limited to such type of apparatus, and may be applied to the handling of any kind of trays.

Figure 1:
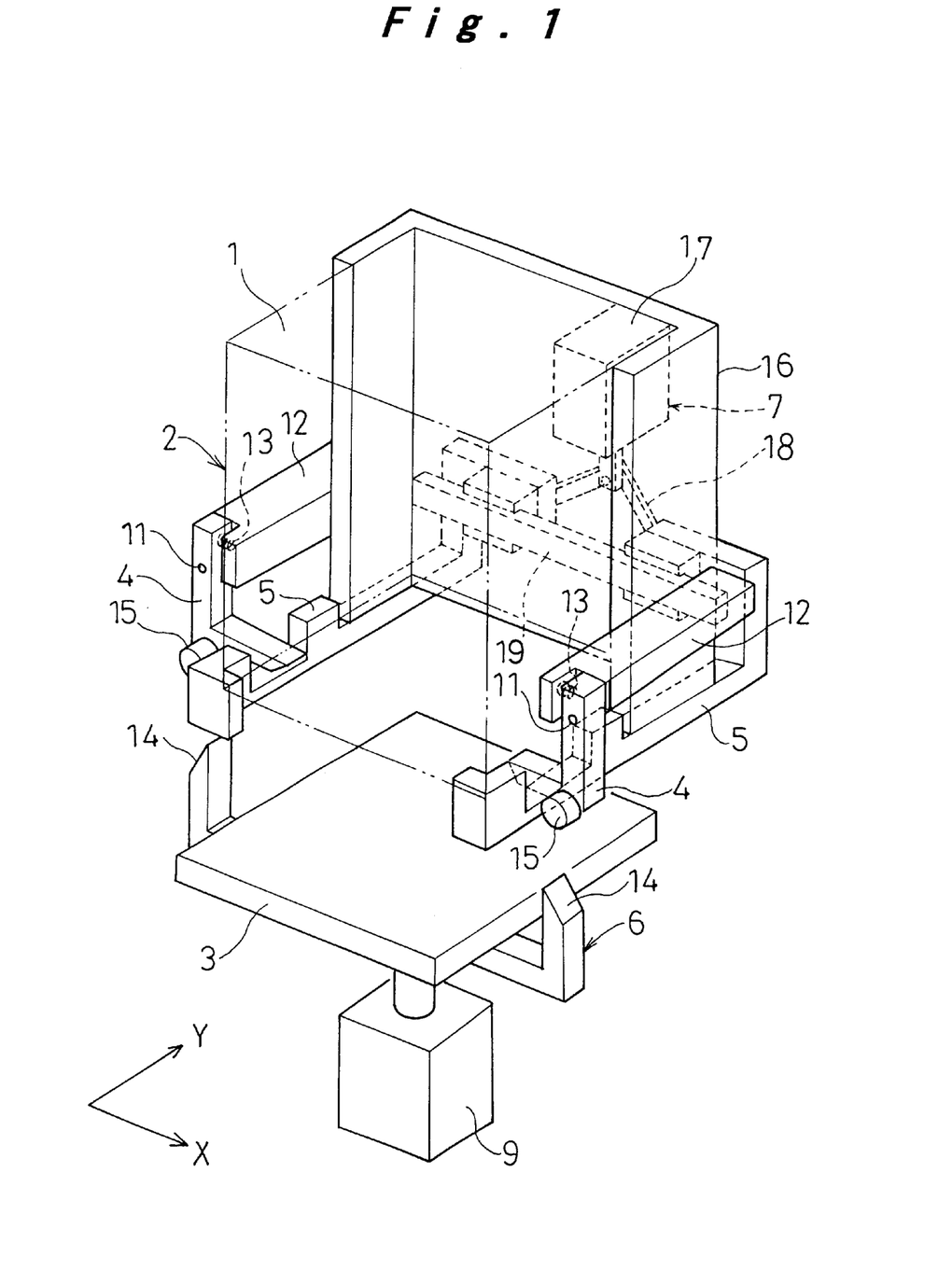
FIG. 1 is a perspective view showing primary parts of a tray storing and feeding apparatus according to one embodiment representative of the present invention.

The tray storing and feeding apparatus of the present invention includes a tray carrier 3 as shown in FIG. 1, for storing the tray 1 in a tray storage section 2 such as to be piled upon one another, as well as for feeding the tray 1 one by one to a prescribed location from the stack of trays in the tray storage section 2. The tray carrier 3 is capable of moving vertically in the tray storage section 2, and of transferring the tray 1 at its lowered position under the tray storage section 2 between the position just below the tray storage section 2 and a prescribed position (not shown) where a new tray is replenished or a prescribed position (not shown) where the loaded components are fed for a certain use.

For the purpose of transferring the tray 1, the tray carrier 3 is mounted on an X-Y table (not shown) which is movable in two, X and Y, directions orthogonal to each other on a horizontal plane, and supported by a hydraulic cylinder 9 such as to be movable upwards and downwards, so that the tray carrier 3 alone is capable of two functions, i.e., storing the tray 1 at the tray storage section 2 and transferring the stored tray 1 to a predetermined position. Of course, it is possible to provide two tray carriers 3, respectively for storing the tray 1 and for feeding the stored tray 1 to the prescribed position.

The tray 1 is brought to the tray storage section 2 from below by an upward movement of the tray carrier 3 in the order of actions respectively shown in FIGS. 2D, 2C, and 2B so as to be stored one by one in a stack. At the tray storage section 2, there is provided a tray receiver 4 which engages with a lower face of a tray 1 that has been brought upward from both sides such as shown in the order of actions shown in FIGS. 2B and 2A so as to support the tray 1 at the tray storage section 2, and retracts from the engaged position to release the tray 1. Conversely, the tray receiver 4 opens and closes as in the order of actions respectively shown in FIGS. 2D, 2C, and 2B so as to receive a tray 1 which is brought upward by the tray carrier 3. There is further provided a tray holder 5 which holds the tray 1 from both sides with a frictional force that has been caught by the tray receiver 4, and opens to release the tray 1. The tray receiver 4 and the tray holder 5 are respectively provided with their open/close mechanisms 6, 7 for timely opening and closing actions.

Although the open/close mechanism is individually provided for each of the tray receiver 4 and the tray holder 5 in this embodiment, it is possible to achieve opening/closing operation of both members with a single mechanism.

Figure 2A:
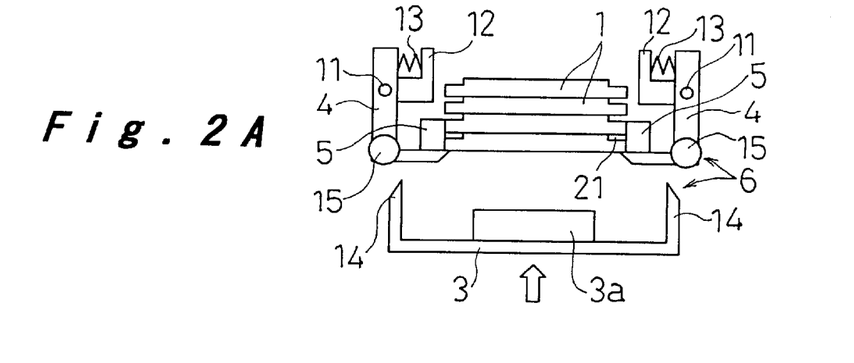
FIG. 2 is an explanatory view showing the apparatus of FIG. 1 in action when feeding the trays.

The tray receiver 4 comprises a pair of L-shaped levers at both sides of the tray storage section 2, which are pivotally supported by axes 11 to a fixed frame 12 mounted to left and right outer sides of a tray storage cover 16. The L-shaped levers are urged by springs 13 inserted between themselves and the fixed frame 12 to remain in engagement with the lower face of the tray 1 from both sides as shown in FIGS. 2A and 2D. The open/close mechanism 6 for the tray receiver 4 is constructed with a cam 14 provided to the tray carrier 3 and a cam follower 15 provided to the tray receiver 4 as shown in FIG. 1, and functions such that the cam 14 causes the tray receiver 4 via the cam follower 15 to retract sidewards from the engaged position shown in FIG. 2D to the state shown in FIG 2C, linking with the ascending movement of the tray carrier 3 for lifting up the tray 1 from the state shown in FIG. 2D to the state shown in FIG. 2C. Conversely, the cam 14 causes the tray receiver 4 via the cam follower 15 to return to the engaged position shown in FIG. 2D from the state shown in FIGS. 2B and 2C, linking with the downward movement of the tray carrier 3 from the position shown in FIG. 2B where the tray has been brought up to the tray storage section 2.

The tray holder 5 is supported such as to be opened and closed by means of a linear guide 19 provided on a back side of the tray storage cover 16, and its opening and closing actions are effected by a hydraulic cylinder 17 via a toggle 18, both of which are mounted on the back side of the tray storage cover 16.

Figure 2B:
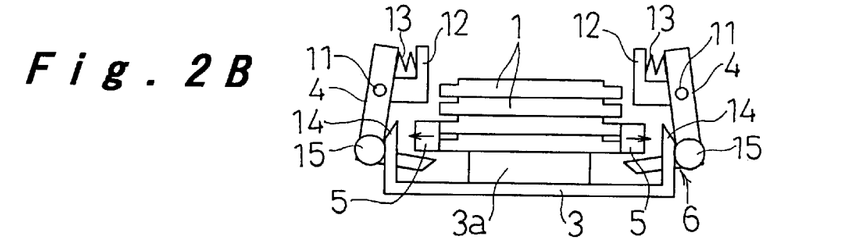
Figure 2C:
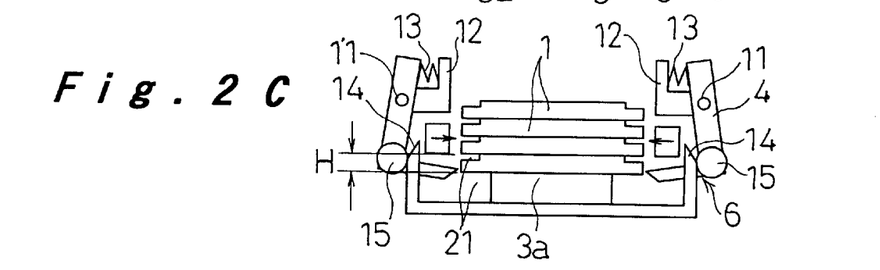
Figure 2D:
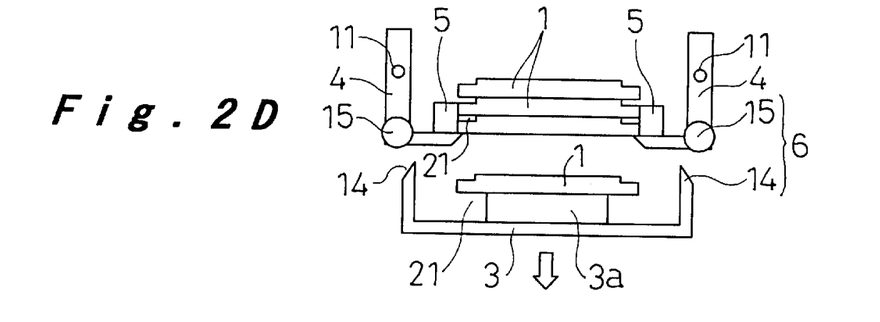

FIGS. 2A–2D show a tray feeding operation in the order of actions from a state of FIG. 2A where the trays 1 are stored in a stack to a state of FIG. 2D where the tray 1 is separated from the other so that the tray 1 is fed to a prescribed position (not shown) for supplying the components for use.

Figure 3A:
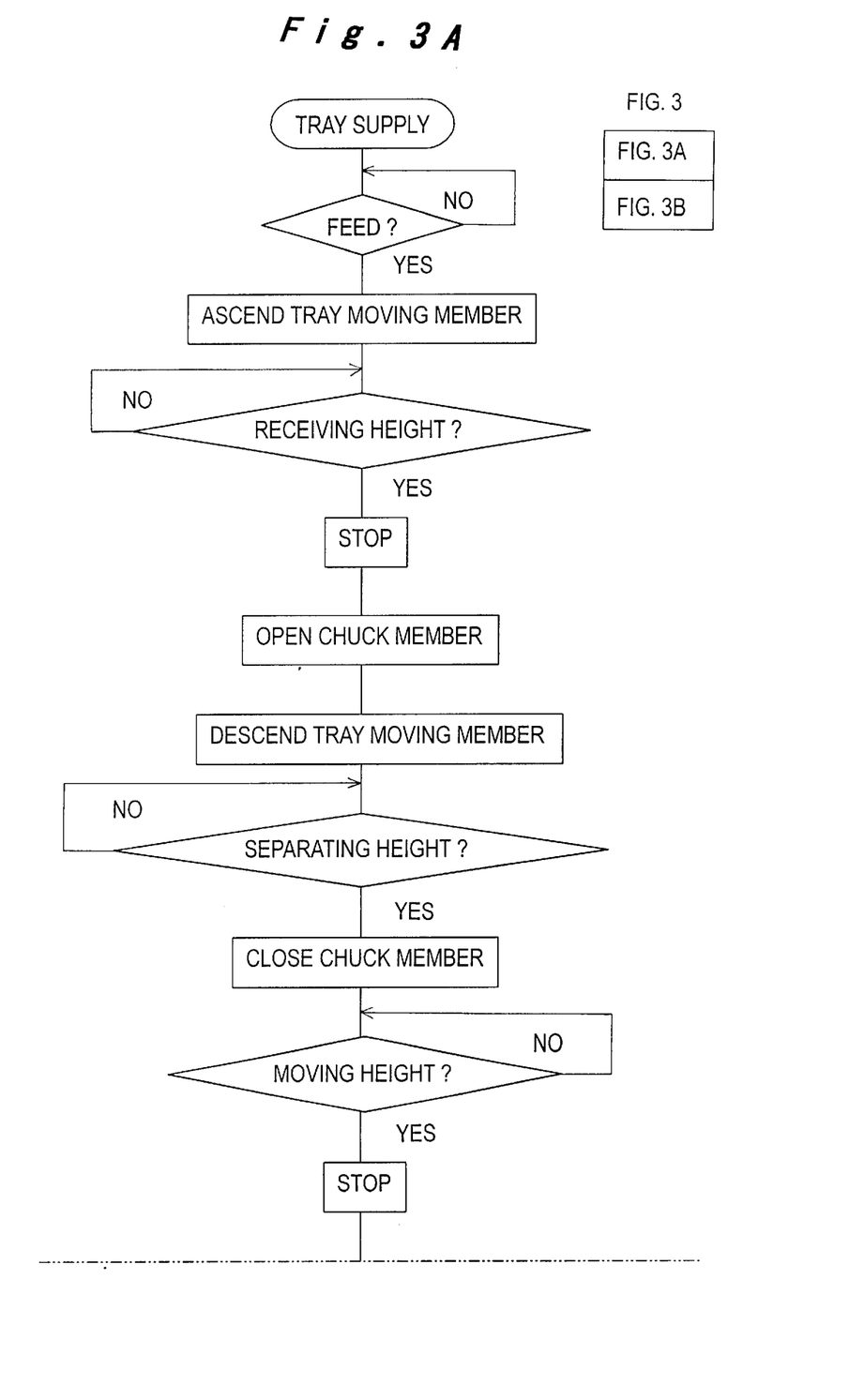
FIGS. 3A and 3B are flow charts showing a sequence of tray feeding actions of the apparatus of FIG. 1.
Figure 3B:
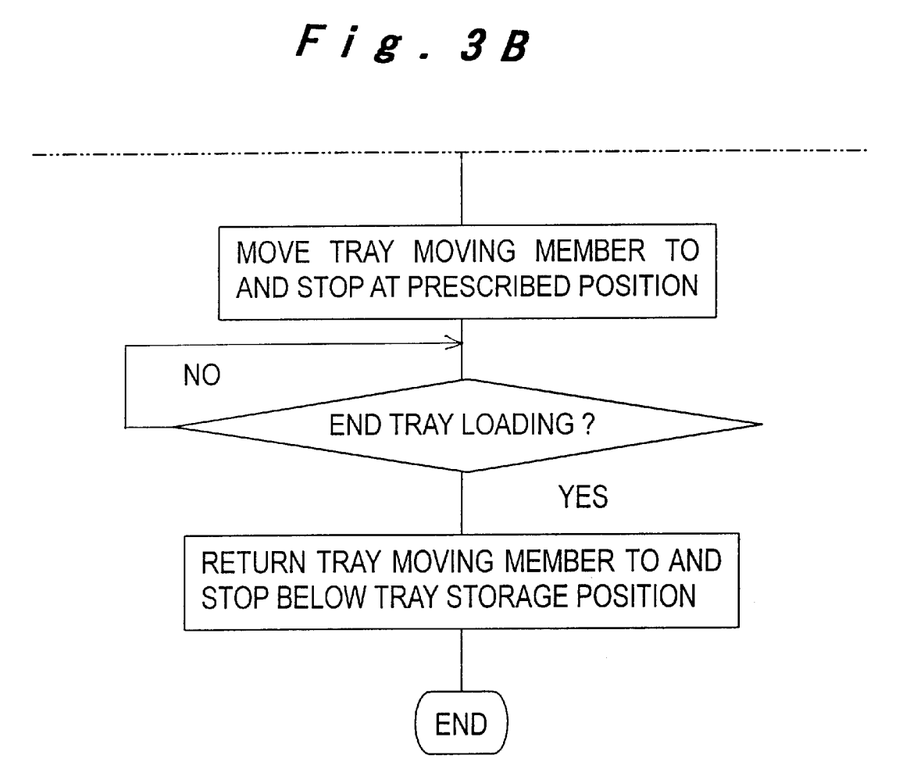

The actions shown in FIGS. 2A–2D will be explained in accordance with flowcharts of FIGS. 3A and 3B which show a specific sequence of actions. The sequence shown in FIGS. 3A and 3B is started when a tray feeding signal is entered to a control system (not shown), due to the completion of mounting operation of components fed from a preceding tray 1 or any other factors.

First, when the tray carrier 3 is located below the tray storage section 2 as shown in FIG. 1 or FIG. 2A, it is lifted up as shown in FIG. 2B. If the tray carrier 3 is located other than below the tray storage section 2, it is first brought to under the tray storage section 2, after which it is ascended.

The upward movement of the tray carrier 3 is stopped when it reaches a certain height appropriate for receiving a stored tray. In this embodiment, for example, the tray carrier 3 is stopped when it has reached a height shown in FIG. 2B where a tray receiving table 3a provided on the tray carrier 3 comes to contact with the lower surface of the lowermost tray 1 of the tray stack, which occurs after the engagement between the tray receiver 4 and the lowermost tray 1 has been released via the cam 14 and the cam follower 15 linking with the upward movement of the tray moving member 3. Such upper limit position of the tray carrier 3 may be determined by the setting of a longest stroke of the cylinder 9. Depending on types of vertical motion actuator, it may be detected that the tray carrier 3 has reached a predetermined receiving height by sensing the location of the tray carrier 3 or any other element linking therewith using a limit switch, photo sensor, or a lead switch, or by counting a time which has passed since the tray carrier 3 started ascending, so as to determine the timing for stopping the upward movement of the tray carrier 3.

After the upward movement of the tray carrier 3 has been stopped, the tray holder 5 is opened in a direction shown by an arrow in FIG. 2B, by which the tray 1 that has been supported at the tray storage section 2 is freed and placed by its own weight on the tray receiving table 3a of the tray carrier 3. Successively, the tray carrier 3 is descended by an amount H which is equivalent to a height of one tray 1 in the stack as shown in FIG. 2C so as to cause a lowermost tray 1 to be out of the tray storage section 2. When the lowermost tray 1 has been lifted down to a certain separating height where it is away enough to be separated from the other trays 1 at the tray storage section 2, the tray holder 5 is closed as shown by the arrow in FIG. 2C. Such separating height may be determined by the setting of a stroke of the cylinder 9. Here again, the timing of closing the tray holder 5 may be determined using a limit switch, photo sensor, or a lead switch, or by counting the time from the point when the tray carrier 3 starts descending. The lowermost tray 1 is thus separated from the other trays by further lowering the tray carrier 3, and the tray receiver 4 is closed at the point when the lowermost tray 1 is lifted down to a certain height, that is, when the lowermost tray 1 has reached a predetermined position low enough to form a space between itself and the tray thereabove into which the tip of the tray receiver 4 can be inserted. The tray receiver 4 can thereby return to the state in engagement with the lower face of the tray 1 from both sides without any interference between itself and the lowermost tray 1 which has just been separated.

The tray carrier 3 is then further lowered until it is stopped when the separated tray 1 reaches a height where it can be transferred to a certain location, after which the tray carrier 3 is transferred to the prescribed location for feeding the components for use. The tray 1 may be then, for example, transferred to a component feeding unit in a circuit substrate manufacturing apparatus or the like with a transfer mechanism, where the components are supplied to be used. After the completion of tray transfer, the tray carrier 3 is returned to and stopped at the position below the tray storage section 2, and waits for the next tray feeding.

It is of course possible to feed the accommodated components without transferring the tray. In such a case, the transfer mechanism of the tray can be omitted, although it may be disadvantageous that the tray carrier 3 cannot be returned until all of the components have been supplied.

As set forth above, in this embodiment, since the tray holder 5 holds the tray 1 with a frictional force from both sides in corporation with the tray receiver 4 which receives and supports by engaging with the underside of the tray 1 from both sides, the tray 1 which is stored in a stack can be reliably supported with both of the tray receiver 4 and the tray holder 5, by which the possibility that the tray may fall by its own weight can be eliminated.

Also, actions for separating the trays 1 one by one from the tray stack and transferring the tray to a prescribed position for feeding the components are carried out as will be described below. The tray receiver 4 and the tray holder 5 are opened linking with the movement of the tray carrier 3 which is moved upward so as to come to contact with the underside of the lowermost tray 1 stored in a stack. The tray carrier 3 is then descended by the amount H which is equivalent to a height of one tray 1 in the tray stack, only when the tray holder 5 closes prior to the closing action of the tray receiver 4 so as to hold with a frictional force the trays 1 except the lowermost tray 1. By further lowering the tray carrier 3, the lowermost tray 1 is separated from the other trays, and the tray receiver 4 is closed at the point when the lowermost tray 1 is lifted down to a certain height, that is, when the lowermost tray 1 has reached a predetermined position low enough to form a space between itself and the tray thereabove into which the tip of the tray receiver 4 can be inserted. The tray receiver 4 can thereby return to the state in engagement with the lower face of the tray 1 from both sides without any interference between itself and the lowermost tray 1 which has just been separated. Accordingly, even when the space 21 between the trays 1 piled upon one another is small or even if there is no such space, the trays 1 stored in a stack can be reliably separated one by one from each other. The moment when the trays 1 are held only by the tray holder 5 with a frictional force is only for an instance when the lowermost tray 1 is being lowered to the outside of the tray storage section 2 so that it does not obstruct the closing action of the tray receiver 4. Due to such frictional support of the tray holder 5, even if the trays slip off, they can only shift downwards slightly, and are prevented from falling off.

Further, the tray carrier 3 is provided with the tray receiving table 3a which forms a wide space 21 between itself and the tray 1 so as to prevent the interference with the tray receiver 4. However, the timing for causing the tray receiver 4 may be made earlier so as to allow the tray carrier 3 to reach a position where it receives the lowermost tray 1 without interfering with the tray receiver 4, in which case the tray receiving table 3a may be omitted.

Figure 4A:
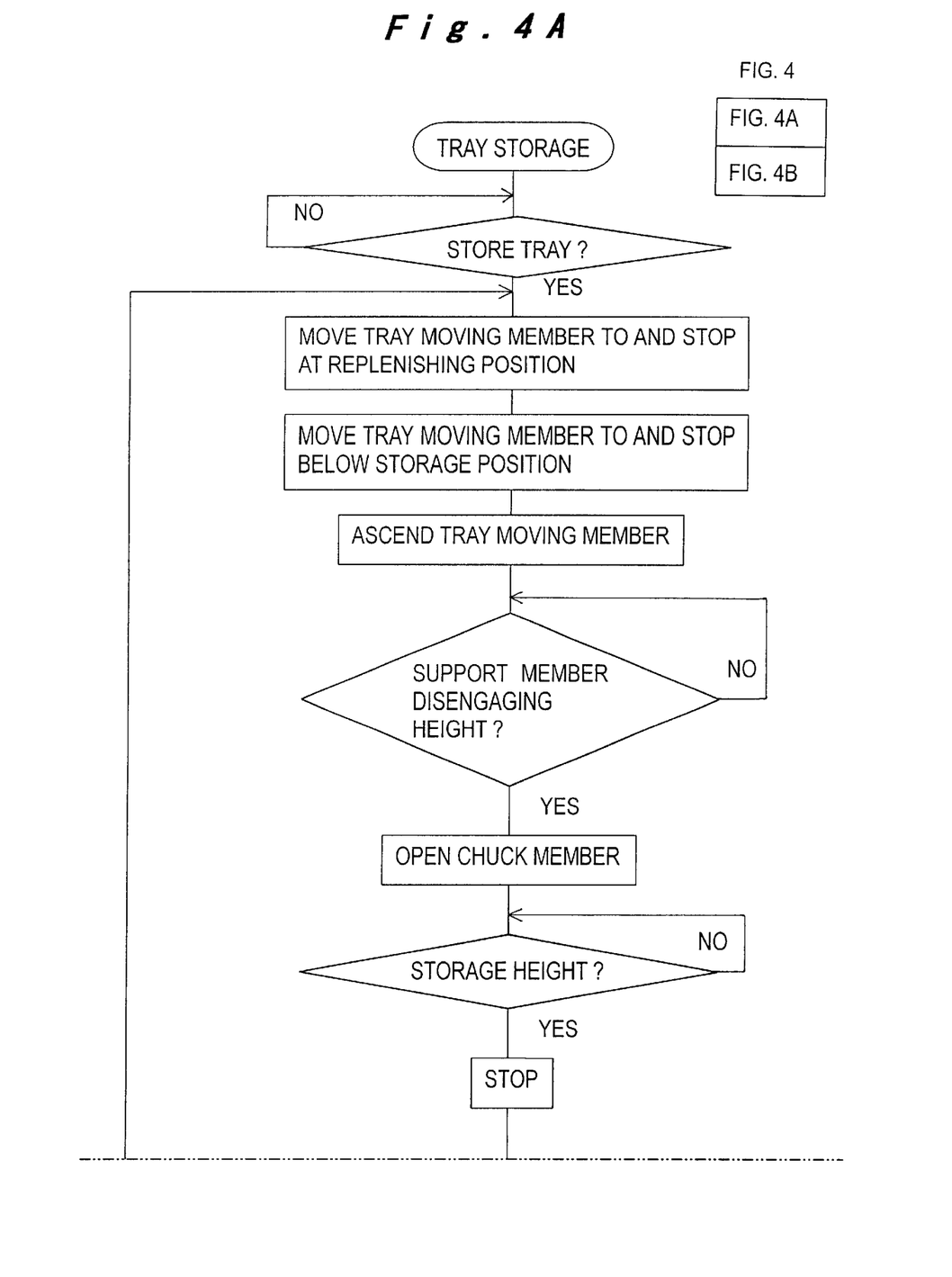
FIGS. 4A and 4B are flow charts showing a sequence of tray storing actions of the apparatus of FIG. 1.
Figure 4B:
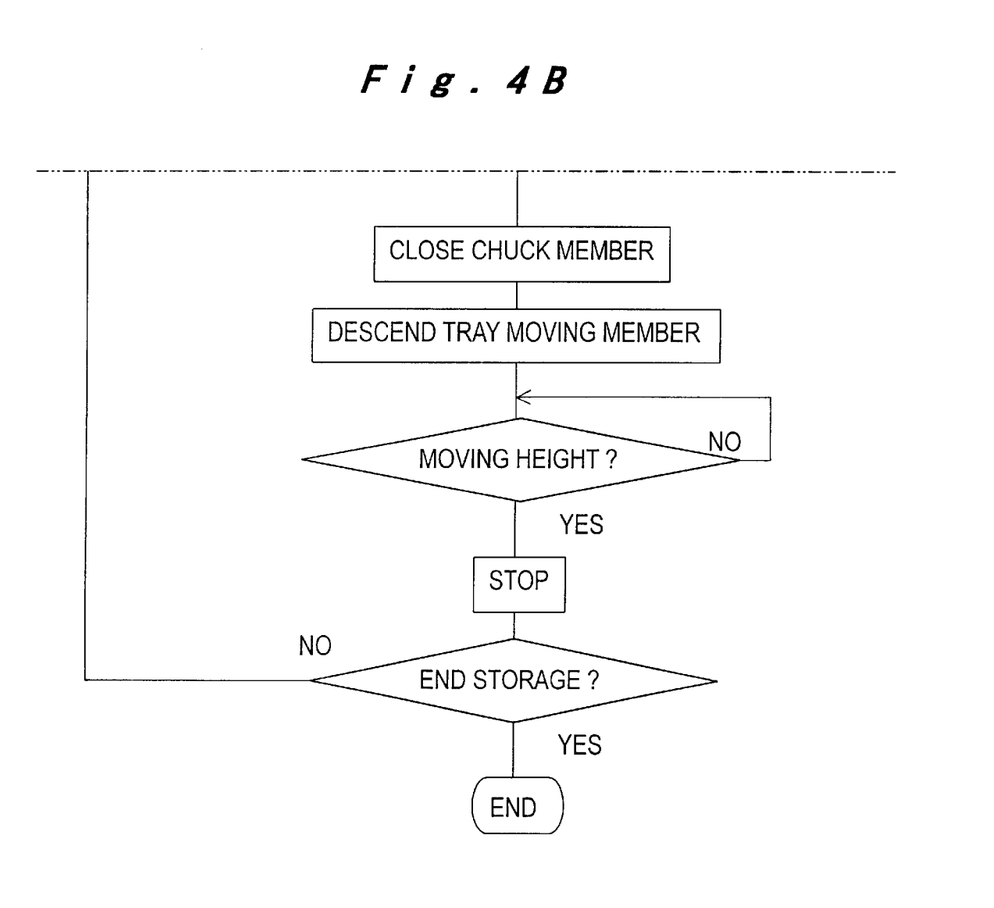

FIGS. 4A and 4B show a sequence of actions for storing the tray 1 fed at a certain location one by one to the tray storage section 2, which is performed in a reverse order of the tray feeding actions, i.e., in the order of actions respectively shown in FIGS. 2D, 2C, 2B, and 2A, and thus a detailed description thereof will be omitted. The tray receiver 4 and the tray holder 5 are opened and closed timely with their respective open/close mechanisms such that when one tray 1 is lifted up to the tray storage section 2 by the tray carrier 3 in the order of actions shown in FIGS. 2D, 2C, and 2B, the tray receiver 4 is opened as illustrated prior to the opening action of the tray holder 5. Thus, even when the space 21 between the two trays 1 is small or even if there is no space therebetween, the tray 1 being lifted up can reach the tray storage section 2 where the other trays 1 are held by the tray holder 5 as shown in FIG. 2C. After that, the tray holder 5 is opened so as to allow the tray 1 which has been lifted up to be received at the tray storage section 2 as shown in FIG. 2C. When there is no other trays 1, the tray which has been lifted up is stored solely, and when there are other trays 1 that are previously stored, the trays are all lifted up together in a sequence of actions shown in FIGS. 2C and 2B so as to store the trays 1 in a stack. Each time one tray 1 is stored, the tray receiver 4 and the tray holder 5 are closed, so that the tray receiver 4 can engage with the lower face of the newly stored tray 1 from both sides in a sequence of actions shown in FIGS. 2B and 2A, thereby supporting the tray 1. As the tray holder 5 holds the newly stored tray 1 from both sides at the same time, the tray 1 can be stored safely without possibility of falling off by its own weight.

In the tray storing process, too, the moment when the tray 1 is held only with the tray holder 5 during the tray 1 needs to be supported is only for an instance when the tray carrier 3 is slightly lowered after the tray 1 has been lifted up to the tray storage section 2. The tray 1 will thus hardly fall off, and the above-said safety is ensured.

Also, since the open/close mechanism 6 for the tray receiver 4 is constructed with the cam 14 and the cam follower 15 which act in synchronism with the vertical movement of the tray carrier 3, opening and closing actions of the tray receiver 4 is repeated with precise and mechanical timing which can be preliminarily determined. Thus, the tray receiver 4 can be opened and closed timely without failure with a simple and inexpensive structure and control of the apparatus.

Figure 7:
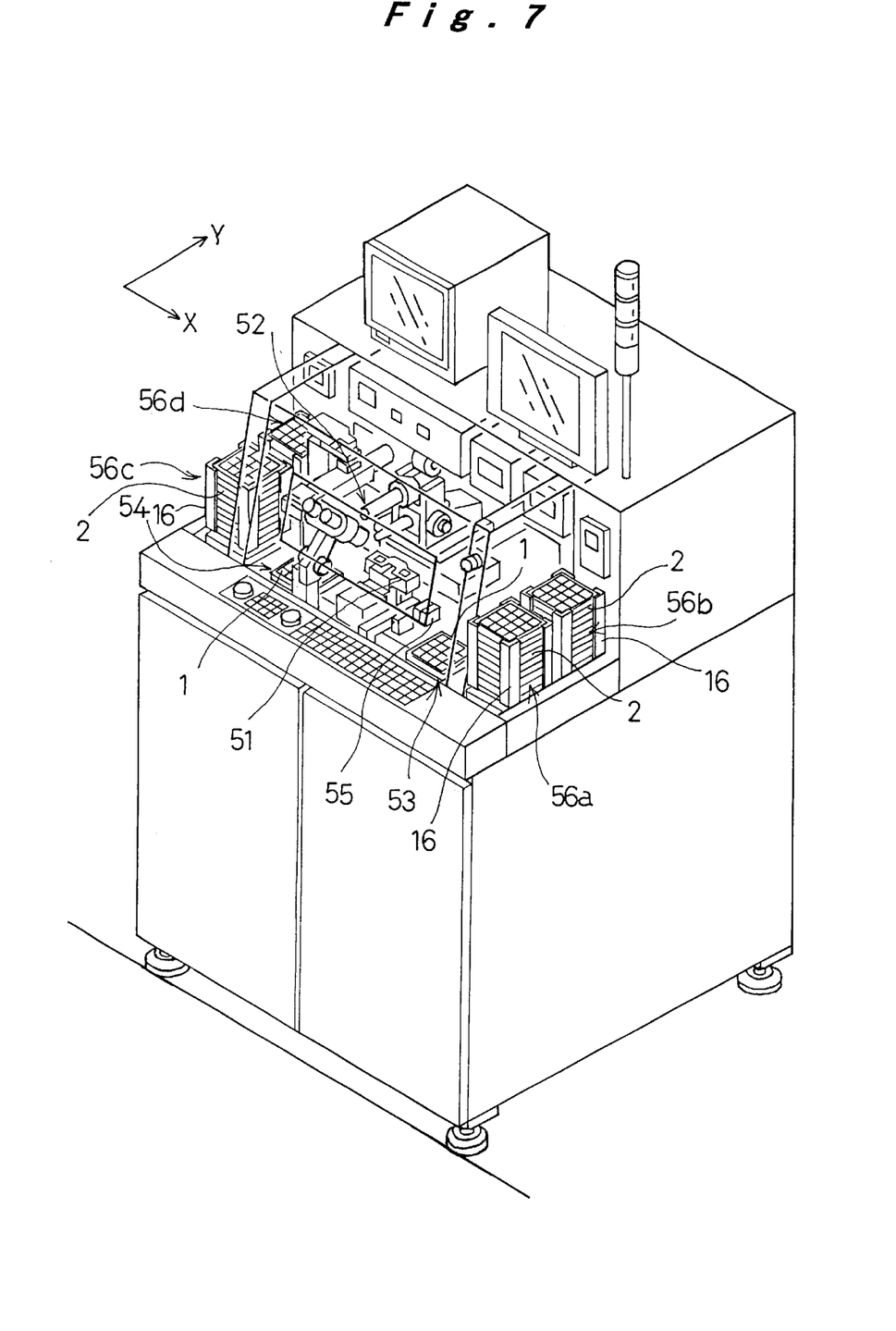
FIG. 7 is a perspective view showing a bump bonder according to one embodiment of the present invention.

Next, a bump bonder in which such tray storing and feeding apparatus as has been described above is incorporated will be hereinafter described with reference to FIG. 7.

The bump bonder shown in the figure is constructed such that a bump is formed on an IC chip supplied onto a bonding stage 51 by a bump forming unit 52 with a wire bonding technique. A chip loading position 53 is located on the right hand side of the bonding stage 51, where a tray 1 accommodating IC chips on which bumps have not yet been formed is fed, while a chip unloading position 54 is located on the left hand side of the bonding stage 51, where a tray 1 carrying IC chips on which bumps have been formed is placed. A transfer head 55 is movable in both X- and Y-directions as well as in a vertical direction, whereby an IC chip is picked up from the tray 1 at the chip loading position 53, and transferred onto the bonding stage 51, or an IC chip on which a bump has been formed on the bonding stage 51 is picked up, and transferred onto the tray 1 at the chip unloading position 54.

At one end of the bump bonder (on right hand side in the figure) is a pair of front and rear tray storing units 56a, 56b. In the tray storage section 2 of the front tray storing unit 56a, trays 1 accommodating IC chips before formation of bumps are stored in a stack, whereas in the tray storage section 2 of the rear tray storing unit 56b, empty trays are piled upon one another. The tray carrier 3 as shown in FIGS. 1 and 2 is disposed below these tray storing units 56a, 56b and the chip loading position 53, and supported on an X-Y table (not shown). The front and rear tray storing units 56a, 56b and the tray carrier 3 constitute the tray storing and feeding apparatus having a construction as shown in FIGS. 1 and 2 and functions which have already been described above in detail. Trays 1 accommodating non-treated IC chips may be, for example, manually inserted in a stack from above into the tray storage section 2 of the tray storing unit 56a. The lowermost tray 1 in the tray storing unit 56a is successively taken out onto the tray carrier 3 and transferred to the chip loading position 53 by means of movement of the tray carrier 3 in X- and Y-directions as well as in a vertical direction. A series of wire bonding operations are carried out until all of the IC chips carried on the tray 1 are used up leaving the tray 1 at the chip loading position 53 empty, after which the tray 1 is transferred by the tray carrier 3 to the rear tray storing unit 56b, and stored from below toward the tray storage section 2. Empty trays 1 which have been successively brought from below to be accumulated in the rear tray storing unit 56b can be readily taken out upwards in a pile.

At another end of the bump bonder (left hand side in the figure) is also a pair of front and rear tray storing units 56c, 56d. In the tray storage section 2 of the front tray storing unit 56c, trays 1 accommodating IC chips on which bumps have been formed are stored in a stack, whereas in the tray storage section 2 of the rear tray storing unit 56d, empty trays are piled upon one another. The tray carrier 3 as shown in FIGS. 1 and 2 is disposed below these tray storing units 56c, 56d and the chip unloading position 54, and supported on an X-Y table (not shown). The front and rear tray storing units 56c, 56d and the tray carrier 3 constitute the tray storing and feeding apparatus having a construction as shown in FIGS. 1 and 2 and functions which have already been described in detail, and perform substantially the same actions as those disposed at the other end of the bump bonder. Empty trays 1 are, for example, manually inserted from above into the tray storage section 2 of the rear tray storing unit 56d. The lowermost tray 1 in the rear tray storing unit 56d is successively taken out onto the tray carrier 3 and transferred to the chip unloading position 54 by means of the movement of the tray carrier 3 in X- and Y-directions as well as in vertical direction. The tray 1 at the chip unloading position 54 is filled with IC chips on which bumps have been formed after a series of wire bonding operation has been carried out, after which the tray 1 is transferred by the tray carrier 3 to the front tray storing unit 56c, and stored from below toward the tray storage section 2 thereof. Trays 1 accommodating IC chips with bumps formed thereon which have been successively brought from below to be accumulated in the front tray storing unit 56c can be readily taken out upwards in a pile.

By adopting the tray storing and feeding apparatus of the present invention to the bump bonder as set forth above, tray exchange can be accomplished without stopping the operation of the bump bonder. Moreover, trays 1 can be readily loaded to and unloaded from each of the tray storing units 56a–56d.

It should be added that the tray storing and feeding apparatus of the present invention may also be incorporated in any other apparatuses which handle electronic components such as an electronic component mounting device.

INDUSTRIAL APPLICABILITY

According to the present invention, trays 1 accommodating electronic components can be safely stored in a pile upon one another, and reliably separated from each other and fed one by one, due to appropriate timing of opening and closing actions of the tray receiver 4 and the tray holder 5. The tray storing and feeding apparatus of the present invention can be thus favorably adopted for use in a bump bonder, electronic component mounting device, or any other apparatuses handling electronic components.

What is claimed is:

1. A bump bonding unit with tray storage and tray feeding apparatuses comprising:
    a first tray storing and feeding apparatus having:
        a first compartment for storing and feeding loading trays stored in a stack and accommodating IC chips prior to a bump bonding operation;
        a second compartment for storing a stack of a first set of empty trays;
        a chip loading location for receiving one of said loading trays; and
        a first tray carrier that extracts a lowermost loading tray from the first compartment and transports the extracted lowermost loading tray to the chip loading location where the tray is emptied, and that transports said emptied tray from the chip loading location to the second compartment where said emptied tray becomes the lowermost tray in the stack of the first set of empty trays;
    a second tray storing and feeding apparatus having:
        a third compartment for storing loaded trays that have the IC chips with a bump formed thereon;
        a fourth compartment for storing a second set of empty trays;
        a chip unloading location for receiving the IC chips with a bump formed thereon; and
        a second tray carrier that extracts a lowermost empty tray from the fourth compartment and transports the extracted lowermost empty tray to the chip unloading location, and that transports a loaded tray that has been loaded with the IC chips that have had a bump formed thereon from the chip unloading location to the third compartment where said tray becomes the lowermost tray in the stack of loaded trays with IC chips with a bump formed thereon; and
        a transfer head that picks up one of the IC chips from a tray at the chip loading location and transfers the picked-up IC chip to a bonding location, and picks up the bonded IC chip oh which a bump has been formed thereon at the bonding location and transfers the bonded IC chip to the loaded tray at the chip unloading location;
    wherein each of said first, second, third, and fourth compartments comprise:
        a tray storage section;
        a vertical tray carrier that is movable up and down under the tray storage section and supports a stack of trays in the tray storage section, and said vertical tray carrier dispenses a lowermost tray from the tray storage section to a prescribed position, said vertical tray carrier further movable laterally beneath the tray storage section to a second position;
        a tray receiver disposed at the tray storage section including a mechanism adapted to close the tray receiver onto first and second sides of a tray to engage with a lower face of the tray stored in the tray storage section and to open said tray receiver by disengaging with the lower face of the tray to thereby release the tray from the tray storage section with an upward movement of the tray carrier; and
        a tray holder at the storage section including a mechanism, adapted to close the tray holder to support a tray being received by the tray receiver by clamping the tray holder against the first and second sides of the tray, and to open the tray holder to release the tray.

2. The bump bonding unit of claim 1, wherein said tray holder and said tray receiver simultaneously engage the same tray in the tray storage section.

3. The bump bonding unit of claim 1, wherein said tray holder and said tray receiver operate together to support and release a tray from the stack of trays in the tray storage section.

* * * * *